United States Patent
Nakazawa et al.

(10) Patent No.: US 7,214,938 B2
(45) Date of Patent: May 8, 2007

(54) SAMPLE OBSERVATION METHOD AND TRANSMISSION ELECTRON MICROSCOPE

(75) Inventors: Eiko Nakazawa, Mito (JP); Isao Nagaoki, Hitachinaka (JP)

(73) Assignees: Hitachi Science Systems, Ltd., Ibaraki (JP); Hitachi High-Technologies Corp., Tokyo (JP)

( * ) Notice: Subject to any disclaimer, the term of this patent is extended or adjusted under 35 U.S.C. 154(b) by 0 days.

(21) Appl. No.: 11/228,400

(22) Filed: Sep. 19, 2005

(65) Prior Publication Data

US 2006/0011838 A1 Jan. 19, 2006

Related U.S. Application Data

(63) Continuation of application No. 10/720,251, filed on Nov. 25, 2003, now Pat. No. 6,982,420.

(30) Foreign Application Priority Data

Nov. 27, 2002 (JP) .............................. 2002-343776

(51) Int. Cl.
*H01J 37/26* (2006.01)
*G21K 7/00* (2006.01)

(52) U.S. Cl. .............. 250/311; 250/305; 250/306; 250/307; 250/310

(58) Field of Classification Search ............ None
See application file for complete search history.

(56) References Cited

U.S. PATENT DOCUMENTS

| 4,618,766 A | 10/1986 | van der Mast et al. |
| 5,706,416 A | 1/1998 | Mann et al. |
| 5,983,251 A | 11/1999 | Martens et al. |
| 6,476,388 B1* | 11/2002 | Nakagaki et al. ........... 250/310 |
| 6,552,340 B1* | 4/2003 | Krivanek et al. ........... 250/310 |
| 6,570,156 B1 | 5/2003 | Tsuneta et al. |
| 6,756,589 B1* | 6/2004 | Obara et al. ................ 250/306 |
| 2002/0028399 A1* | 3/2002 | Nakasuji et al. ............. 430/30 |
| 2003/0039386 A1 | 2/2003 | Ishitani et al. |

FOREIGN PATENT DOCUMENTS

| JP | 62-078684 | 4/1987 |
| JP | 64-023379 | 1/1989 |
| JP | 9-245709 | 9/1997 |
| JP | 2001-006588 | 1/2001 |
| JP | 2001-068050 | 3/2001 |
| JP | 2001-118535 | 4/2001 |
| JP | 2002-25491 | 1/2002 |

* cited by examiner

*Primary Examiner*—Nikita Wells
(74) *Attorney, Agent, or Firm*—Dickstein Shapiro, LLP (57) ABSTRACT

Preparations are made for the transmission image of an object tilted as a reference image and the image obtained by polar coordinate conversion of this transmission image, and correlation is established with the image obtained by polar coordinate conversion of the transmission image of the object in a sample.

6 Claims, 13 Drawing Sheets

REFERENCE IMAGES OF THREE TYPES OF VIRUSES A, B AND C

| TILT ANGLE | −60° | −30° | 0° | +30° | +60° |
|---|---|---|---|---|---|
| Virus A (FILE NAME) | Ra1 RAa1 | Ra2 RAa2 | Ra3 RAa3 | Ra4 RAa4 | Ra5 RAa5 |
| Virus B (FILE NAME) | Rb1 RAb1 | Rb2 RAb2 | Rb3 RAb3 | Rb4 RAb4 | Rb5 RAb5 |
| Virus C (FILE NAME) | Rc1 RAc1 | Rc2 RAc2 | Rc3 RAc3 | Rc4 RAc4 | Rc5 RAc5 |

("RAn" IN THIS TABLE INDICATES THE IMAGE OF Rn AFTER POLAR COORDINATE CONVERSION)

EXAMPLE OF LISTING THE REFERENCE
IMAGES BY DEGREE OF AGREEMENT

| 85~100% | Rb2 | RAb2 | | | |
|---|---|---|---|---|---|
| 50~84% | RAb4 | Rb3 | | | |
| 0~49% | RAb1 | RAb5 | Rc3 | Rc5 | RAc5 |

FIG. 10(c)

EXAMPLE OF LISTING THE DEGREE OF
AGREEMENT WITH REFERENCE IMAGE

| Ra1 18% | Ra2 12% | Ra3 21% | Ra4 45% | Ra5 22% |
|---|---|---|---|---|
| RAa1 25% | RAa2 8% | RAa3 15% | RAa4 18% | RAa5 15% |
| Rb1 42% | Rb2 97% | Rb3 65% | Rb4 44% | Rb5 78% |
| RAb1 25% | RAb2 12% | RAb3 | RAb4 6% | RAb5 15% |
| Rc1 7% | Rc2 12% | Rc3 8% | Rc4 6% | Rc5 5% |
| RAc1 15% | RAc2 8% | RAc3 6% | RAc4 3% | RAc5 5% |

EXAMPLE OF LISTING THE AGREEMENT
WITH SPECIFIED REFERENCE IMAGE

| REFERENCE IMAGE | Rb1 | Rb2 | Rb3 | Rb4 | Rb5 |
|---|---|---|---|---|---|
| SEARCH RESULT | No.004 | | No.002 No.003 | No.006 | |
| DEGREE OF AGREEMENT (%) | 87% | | 95% | 88% | |

| SAMPLE | No.001 | No.003 | No.004 | No.005 | No.006 |
|---|---|---|---|---|---|
| DEGREE OF AGREEMENT | 0% | 100% | 5% | 0% | 0% |

○ ORIGIN OF POLAR COORDINATE CONVERSION

○ ORIGIN OF POLAR COORDINATE CONVERSION

SAMPLE OBSERVATION METHOD AND TRANSMISSION ELECTRON MICROSCOPE

This application is a continuation application of Ser. No. 10/720,251, filed Nov. 25, 2003 now U.S. Pat. No. 6,982,420, the disclosure of which is incorporated by reference in its entirety.

FIELD OF THE INVENTION

The present invention relates to a transmission electron microscope and simple observation method using the same, particularly to a transmission electron microscope and simple observation method using the same capable of selecting a targeted sample from the field of view including the samples tilted in various angles.

RELATED ART

The sample observed by the transmission electron microscope is inclined in various directions with respect to the electron beam incoming direction. Accordingly, even in the samples having the same 3-dimensional structure, the transmission image may take on a hexagonal form or an octahedral form, depending on the state of inclination, as in the case of a virus particle having a regular dodecahedron. As described above, it requires experience and intuition of an observer and takes a lot of time to find out a sample having a particular form in a field of view where a great number of samples of different shapes are present. For a sample having a polyhedral structure, the profile of the transmission image varies according to the tilt angle of the sample. This makes it difficult to determine if a sample having bee found out has the desired profile.

One of the ways to solve this problem is to observe the 3-dimensional structure of a sample. To observe the three-dimensional structure of a sample using a transmission electron microscope, a stereo-viewer is used to observe two stereoscopic photographs obtained by tilting the sample by a certain angle in the positive and negative directions.

The Patent Document 1 describes the method of using a scanning electron microscope to determine the position of the targeted pattern according to the degree of similarity with a register pattern. The detected pattern position can be detected only from the positional relationship with the registered pattern. Further, all conditions for reproducing the image of the detected position including the observation conditions are detected using the position relationship (offset) with respect to the detected pattern. The perfect compatibility between the detected pattern and its position is not taken into account. When the sample once taken out is put back into the electron microscope to be searched again, the offset must be set again since the registered pattern by offset is set. Further, no consideration is given to the pattern when the sample is tilted. When the sample is rotated, there is a deviation in the positional relationship between the registered pattern and detected pattern. Accordingly, the offset registered in advanced becomes invalid.

Patent Document 1: Japanese Patent Laid-Open Publication No. 09-245709 (1997)

The aforementioned prior-art fails to give consideration to the work of finding out a targeted object where the apparent profile of the object varies according to the tilt angle of a sample. This has raised problems in the accuracy of sample searching. Namely, a stereoscopic pair is obtained by tilting the sample in the positive and negative directions with respect to optical axis, and is observed by a stereo-viewer, thereby observing the three dimensional structure of the object. This method has the defect of being too intuitive and is inferior in scientific precision. An attempt is often made to provide a schematic representation of the structure by line drawing. This method depends on manual work and is hence used only as supplementary means for grasping the three-dimensional structure.

SUMMARY OF THE INVENTION

An object of the present invention is to provide a transmission electron microscope that permits accurate and efficient selection of a targeted object from the field of view including objects tilted in various angles, and reproduces the observation conditions for the targeted object whenever required.

DESCRIPTION OF THE INVENTION

To achieve the aforementioned object, the present invention provides a sample observation method comprising a step of recognizing the image of an object in the transmission electron beam image of a sample by comparing it with a previously stored reference image. This sample observation method is characterized by further comprising the steps of specifying an object in the transmission electron beam image wherein multiple pairs of transmission electron beam images of multiple objects having a different tilt angle with respect to the optical axis are stored as the reference images for the objects; computing the correlation between the specified object image and the reference image; and displaying the result of computation.

The sample observation method provided by the present invention comprises a step of recognizing the image of an object in the transmission electron beam image of a sample by comparing it with a previously stored reference image. This sample observation method is characterized by further comprising the steps of specifying an object in the transmission electron beam image wherein multiple images formed by polar coordinate conversion of transmission electron beam images of multiple objects are stored as the reference images; carrying out polar coordinate conversion of the image of the specified object; computing the correlation of the images between the specified object image having been subjected to polar coordinate conversion and the reference image; and displaying the result of computation.

The electron beam transmission image of an object is preferred to be composed of a set of multiple electron beam transmission images of the object having different tilt angles with respect to optical axis. In this case, the image having been subjected to the polar coordinate conversion is prepared for each of multiple electron beam transmission images of the object having different tilt angles with respect to optical axis. The rotary fulcrum for polar coordinate conversion of the object image may be specified in the transmission electron beam images.

The result of computing the correlation of the images can be displayed in terms of the degree of agreement between images. It can be displayed in various ways; by listing in the descending order of the degree of agreement; by displaying images according to class wherein the degree of agreement is classified into several classes having a certain range; and by listing such identifiers as image names and the degrees of agreement.

The sample observation method for searching the same objects in multiple objects in the transmission electron beam images of a sample according to the present invention comprises steps of selecting multiple objects in the transmission electron beam images of a sample; carrying out polar coordinate conversion of each of the selected multiple object images; specifying one of the multiple objects; computing the correlation between the image of the specified object subsequent to polar coordinate conversion and the images of other objects subsequent polar coordinate conversion; and displaying the result of computation.

It is preferred that the apparatus data items during transmission electron beam photographing of a sample be stored in the form associated with transmission electron images of the sample in a one-to-one relationship. This can be achieved, for example, by storing the transmission electron beam images of the sample as images in the TIFF format including the tag area and storing the apparatus data in the tag area. When this method is utilized, the apparatus data stored in the tag area can be set in the transmission electron microscope and the conditions for photographing the transmission electron beam images including the targeted object can be reproduced.

The present invention ensures efficient and accurate searching of the targeted sample by selecting the specific object image based on the degree of agreement with the reference image and reproducing the observation conditions on the electron microscope automatically.

DESCRIPTION OF THE PREFERRED EMBODIMENTS

Figure 1:
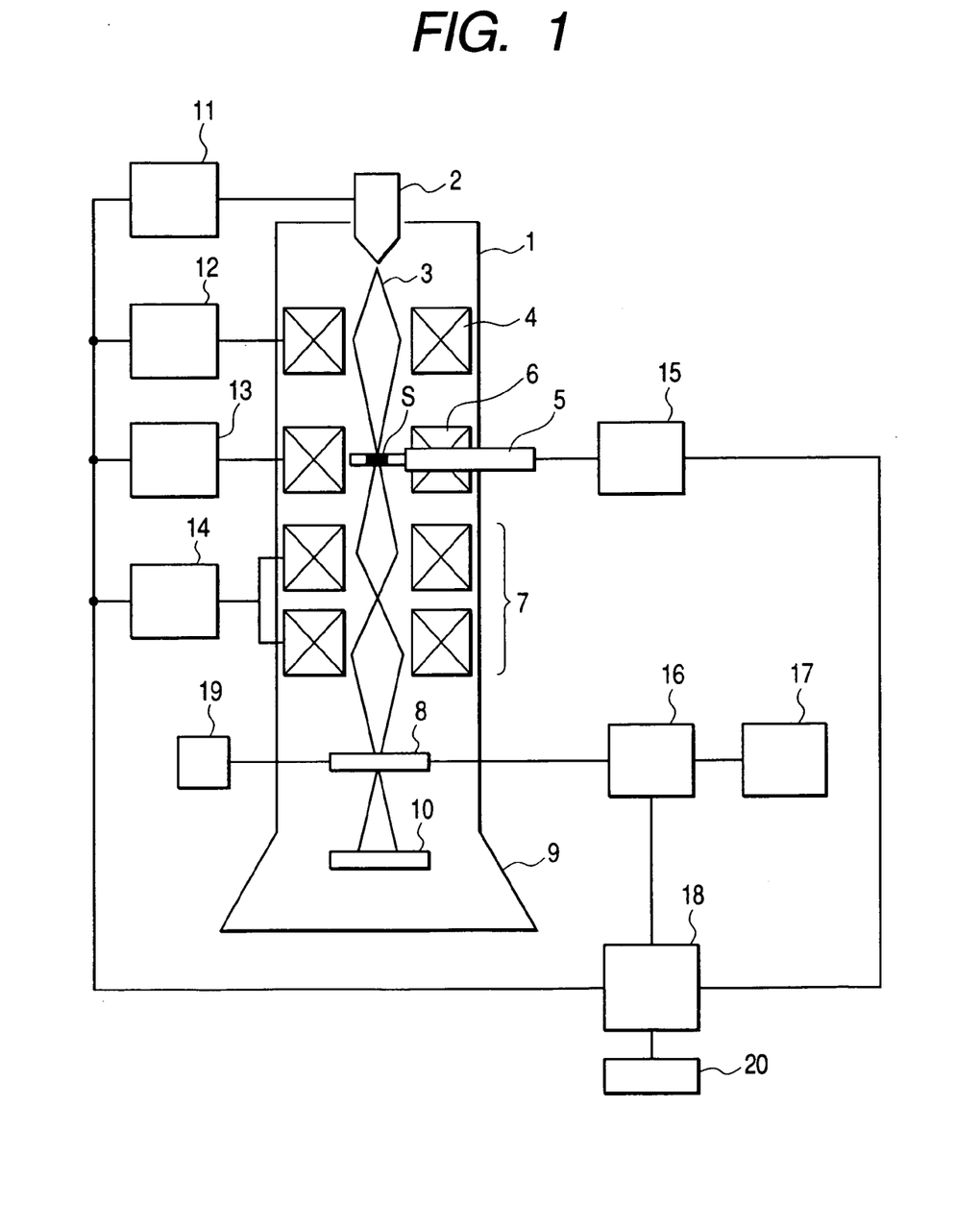
FIG. 1 is a block diagram representing an example of the configuration of a transmission electron microscope according to the present invention.

The following describes the embodiments of the present invention with reference to drawings:

FIG. 1 is a block diagram representing an example of the configuration of a transmission electron microscope according to the present invention;

The electron beam 3 emitted from the electron gun 2 of the transmission electron microscope 1 is applied to a sample S held by a sample stage 5, by means of an irradiation lens 4. The electron beam image having passed through the sample S is magnified by the object lens 6 and magnifying lens system 7, and is projected in the TV camera 8. The TV camera 8 is equipped with a scintillator plate and image-capturing device such as a CCD. The electron beam image projected thereto is supplied to a TV camera controller 16 and is converted into the image signal. The image signal is sent to the monitor 17 and is displayed on the monitor 17 as an image. Further, the image signal outputted from the TV camera controller 16 is supplied to an administration controller 18 and is stored as image data. The bottom of the transmission electron microscope 1 is formed into a camera chamber 9 and a fluorescent screen 10 is arranged therein. The electron beam of a sample can be observed on the fluorescent screen 10 by causing the TV camera 8 to deviate from the optical axis of the electron beam 3 by a TV camera drive 19.

The electron gun 2 is controlled by the electron gun controller 11, irradiation lens 4, object lens 6 and magnifying lens system 7 are controlled by an irradiation lens controller 12, an object lens controller 13 and a magnifying lens system controller 14, respectively. The sample stage 5 is controlled by a sample stage controller 15. These controllers 11 through 15 constitute an observation condition controller. The controllers 11 through 15 constituting an observation condition controller are connected to the administration controller 18 via a transmission line to allow exchange of data. The observation conditions can be set from the administration controller 18. The administration controller 18 is provided with a computer loaded with a certain program, and the input means 20 such as a keyboard is connected thereto. It generates the control data required for the control of controllers 11 through 15.

The following describes the operation of the transmission electron microscope according to the present invention: The administration controller 18 takes charge of four types of processing; image recording, image recognition, image search and image calling. Image recording is the processing carried out when a desired sample is observed. Image recognition is the processing of making a decision on whether or not a desired object recorded by image recording is equal to the already stored image data (reference), or determining the data of reference image to which the desired object corresponds. Image search is the processing of finding out the reference object to which a desired object corresponds, or the object having the same profile as that of the desired object among multiple predetermined objects. Image calling is the processing of reproducing and observing the observation conditions for the searched object.

In the preferred embodiment of the present invention, an image correlation is utilized to determine the similarity between the transmission image of the object in the samples and reference image. The following describes the outline of the phase-restricted correlation an example of the image correlation. Phase-restricted correlation is defined as one of the image computations modified in such a way that the amplitude component of the input image is replaced by the fixed value, in the computation process of correlation using the Fourier transform. ("Principle of phase-restricted correlation and its application"; by T. Kobayashi, Technical Report of Television Institute of Television Engineers of Japan. pp 1–6, No. 41, Vol. 20 (1996)). Only the phase spectrum is extracted out of the amplitude spectrum and phase spectrum obtained by the discrete Fourier transform of the image (transmission image), and the correlation image is obtained by inverse Fourier transform.

When there are two transmission images f1(m, n) and f2(m, n), the discrete Fourier images F1(u, v) and F2(u, v) can be defined by the following equations, respectively. In this case, m=0, 1, 2, . . . , M−1: n=0, 1, 2, . . . N−1: u=0, 1, 2, . . . , M−1; v=0, 1, 2, . . . , N−1. A(u, v) and B(u, v) denote the amplitude spectrum, while θ(u, v) and φ(u, v) indicate the phase spectrum.

[Mathematical Formula 1]

$$F1(u, v) = \sum_{m=0}^{M-1}\sum_{n=0}^{N-1} f1(m, n)e^{-j2\delta\left(\frac{mu}{M}+\frac{mv}{N}\right)} = A(n, v)e^{j\theta(u,v)} \quad (1)$$

$$F2(u, v) = \sum_{m=0}^{M-1}\sum_{n=0}^{N-1} f2(m, n)e^{-j2\delta\left(\frac{mu}{M}+\frac{mv}{N}\right)} = B(n, v)e^{j\phi(u,v)} \quad (2)$$

In the phase-restricted correlation, the amplitude spectra A(u, v) and B(u, v) of F1(u, v) and F2(u, v) are used as fixed values; therefore, the images having only the phase information are obtained. Assuming that these phase images are F1'(u, v) and F2'(u, v), definition is given by Eq. (3) and (4):

[Mathematical Formula 2]

$$F1'(u,v)=e^{j\theta(u,v)} \quad (3)$$

$$F2'(u,v)=e^{j\theta(u,v)} \quad (4)$$

The composite image H12(u, v) is obtained by multiplying the phase image F1'(u, v) by the complex conjugate of F2'(u, v). To be more specific, the phase difference is calculated for each pixel, as shown in Eq. 5.

[Mathematical Formula 3]

$$H12(u, v) = F1'(u, v)(F2'(u, v))^* \quad (5)$$
$$= e^{j(\theta-\phi)}$$

The correlative intensity image is obtained by inverse Fourier transform of the composite image, and is given by Eq. (6), provided that r=0, 1, 2, . . . M−1; s=0, 1, 2, . . . , N−1.

[Mathematical Formula 4]

$$G12(r, s) = \sum_{m=0}^{M-1}\sum_{n=0}^{N-1}(H12(u, v))e^{j2\delta\left(\frac{ur}{M}+\frac{vs}{N}\right)} \quad (6)$$
$$= \sum_{m=0}^{M-1}\sum_{n=0}^{N-1}(e^{j(\theta-\phi)})e^{j2\delta\left(\frac{ur}{M}+\frac{vs}{N}\right)}$$

The phase-restricted correlation is completely immune from image brightness. So the apparent thickness of the sample varies according to the tilt angle of the sample, and there is no need of readjusting the irradiation conditions, even if the irradiation conditions are changed.

Figure 2A:
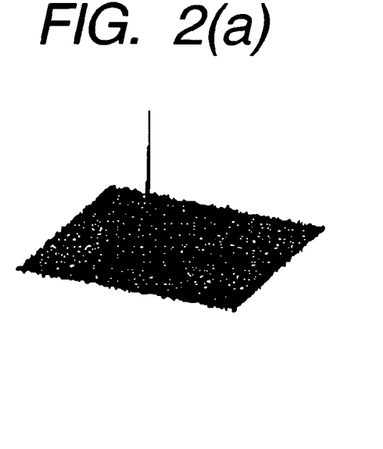
FIGS. 2(a) and 2(b) are diagrams representing the spectrum of a correlative intensity image.
Figure 2B:
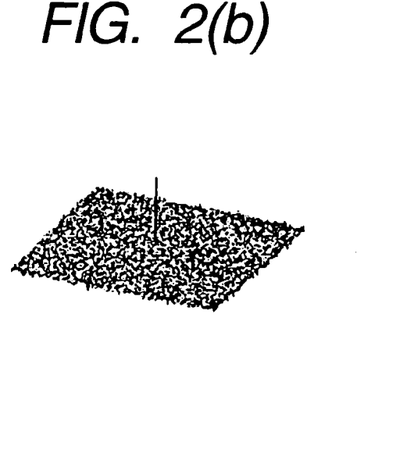

FIG. 2 is a diagram representing the spectrum of the correlative intensity image an example of the result of correlation obtained from phase-restricted correlation. FIG. 2(a) indicates the correlative intensity peak when similarity between two images is high. FIG. 2(b) indicates the correlative intensity peak when similarity between two images is not very high. As shown above, the similarity of images can be evaluated according to the height of the correlative intensity image peak. When images are perfectly equal to each other, the height of the autocorrelation peak is assumed as 100 or 1, and the relative peak height with respect to it can be expressed as the degree of agreement.

The transmission image of the object as an item to be searched may be turning about optical axis with respect to the reference image. To find a correlation between the object image and reference image in this case, one can find a phase-restricted correlation between the object image having been subjected to polar coordinate conversion and reference image.

Figure 3A:
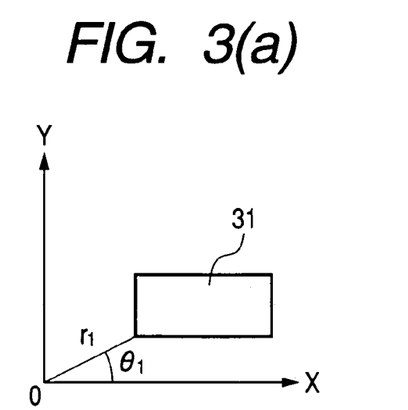
FIGS. 3(a) through 3(c) are schematic views showing polar coordinate conversion.
Figure 3B:
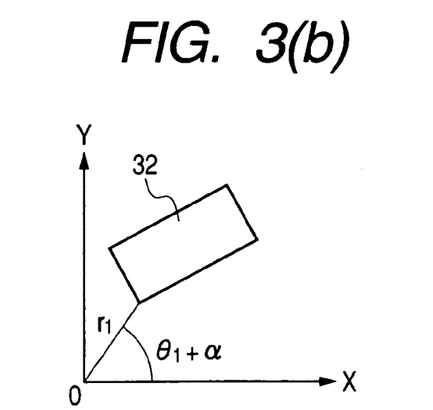
Figure 3C:
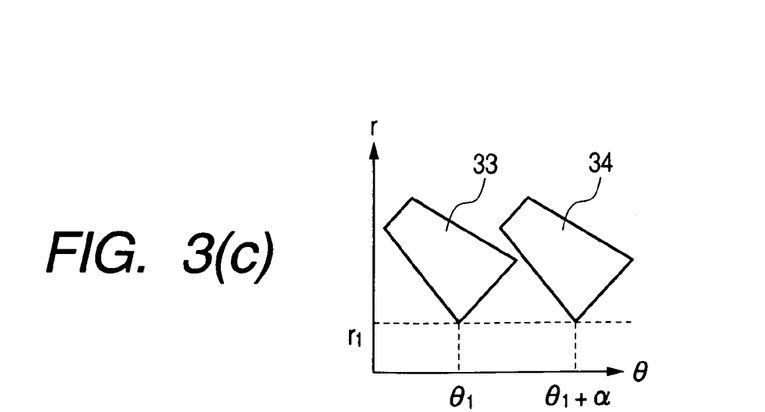

FIG. 3 is a schematic view showing polar coordinate conversion. The coordinates (x, y) of the X-Y plane can be expressed by the following polar coordinates (r, θ):

[Mathematical Formula 5]

$$r=\sqrt{x^2+y^2} \quad (7)$$

$$\dot{e}=arc\tan y/x \quad (8)$$

Let us consider the case where the objects of the same profile rotate about the origin on the X-Y plane. For example, consider the case where the rectangular object 31 whose apex was located at (r₁, θ₁) shown in FIG. 3(a) has rotated about the coordinate origin by angle α, as shown in FIG. 3(b). Then the apex (r₁, θ₁) of the rectangular object 31 is located at point (r₁, θ₁+α) for the rectangular object 32 having rotated by angle α. Similarly, a given point (r, θ) on the object 31 shown in FIG. 3(a) goes to the point (r, θ) of the object 32 having rotated, as shown in FIG. 3(b). The object before and after rotation is plotted on the two-dimensional coordinates where "r" is assigned on the vertical axis and θ on the horizontal axis. This will provide the objects 33 and 34 shown in FIG. 3(c). To be more specific, rotation about the origin in the X-Y plane is converted into the parallel motion in the θ direction in the two-dimensional coordinate system having undergone polar coordinate conversion. Therefore, when comparison is made between the images subjected to polar coordinate conversion, similarity between two images can be obtained without being affected by rotation about the origin on the X-Y plane.

However, when the image on the X-Y plane is subjected to polar coordinate conversion so that it is converted to an image on the r-θ plane, the profile of the image on the r-θ plane varies according to where the origin is set. Accordingly, the origin when the transmission image of the object is subjected to polar coordinate conversion must be equal to the origin when the reference image is subjected to polar coordinate conversion. Thus, it is possible to specify a certain point in the image as a fulcrum so that "r" will be made constant by the transmission image of the object and reference image, and to captures an image having a certain size around it, whereby this image is subjected to polar coordinate conversion. For a digital image photographed by a CCD camera or the like, for example, the characteristic point of the image can be specified as an origin by manual operation by observing it on a monitor.

Figure 14A:
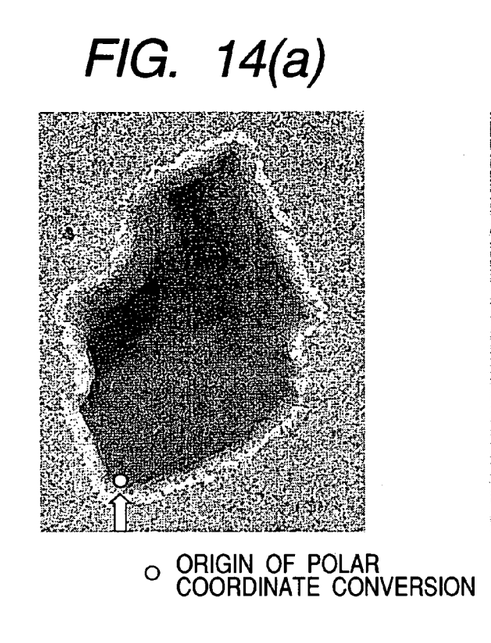
FIGS. 14(a) and 14(b) are diagrams representing a transmission image where the origin for polar coordinate conversion is indicated.
Figure 14B:
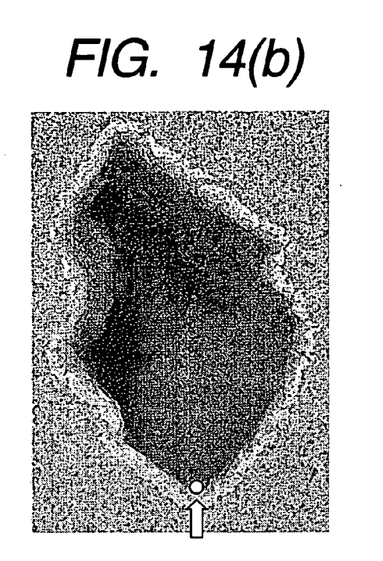
Figure 15A:
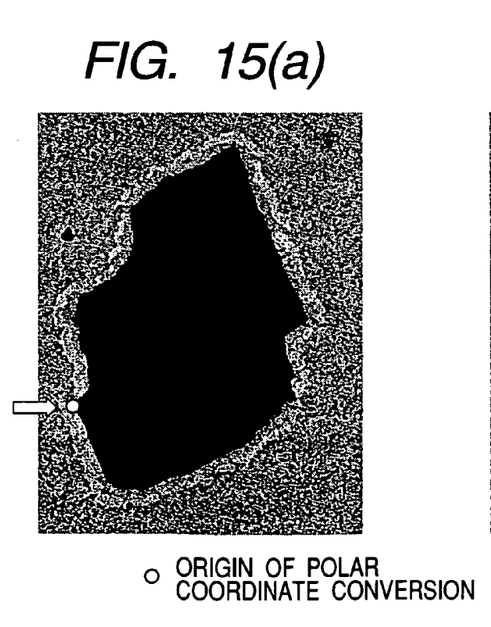
FIGS. 15(a) and 15(b) are diagrams representing a transmission image where the origin for polar coordinate conversion is indicated on the image having been subjected to binarization.
Figure 15B:
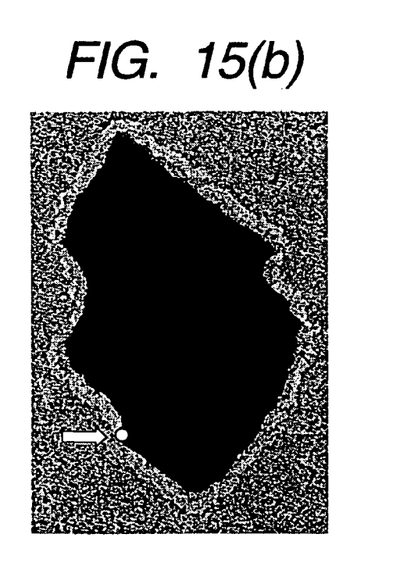

FIG. 14 shows an example of extracting the characteristic point using an actual sample. The image is obtained by photographing the transmission electron beam image of a sample by a CCD camera. The transmission image of FIG. 14(a) is the reference image. The characteristic point of the transmission image is indicated by an arrow mark. This point is assumed as an origin of the polar coordinate, and conversion processing is applied. To capture the characteristic point, the image can be subjected to binarization. FIG. 15 is an example of binarization of the image shown in FIG. 14. The characteristic point extracted by binarization is indicated by an arrow mark. This can be used as an origin.

Figure 4A:
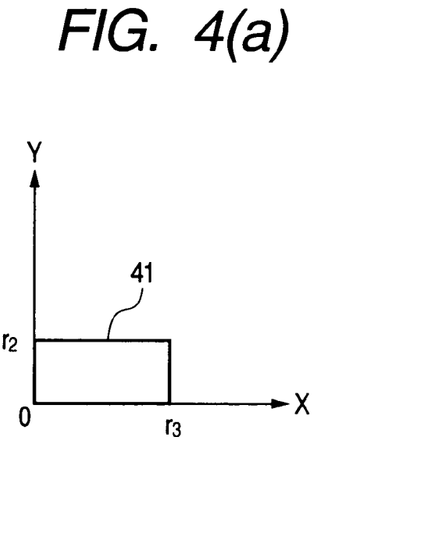
FIGS. 4(a) through 4(c) illustrate an example of polar coordinate conversion where a point on the contour of an image on the X-Y plane is used as an origin.
Figure 4B:
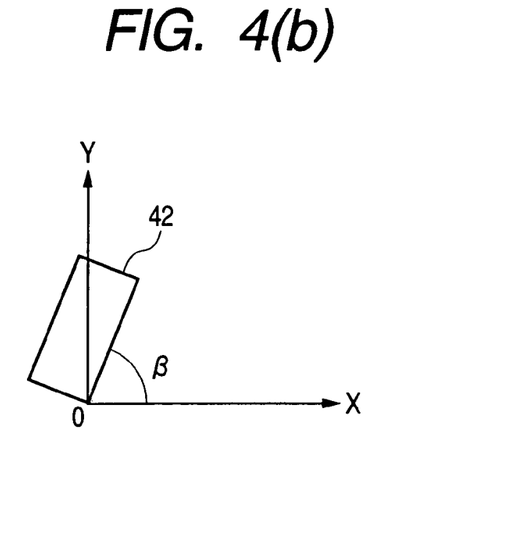
Figure 4C:
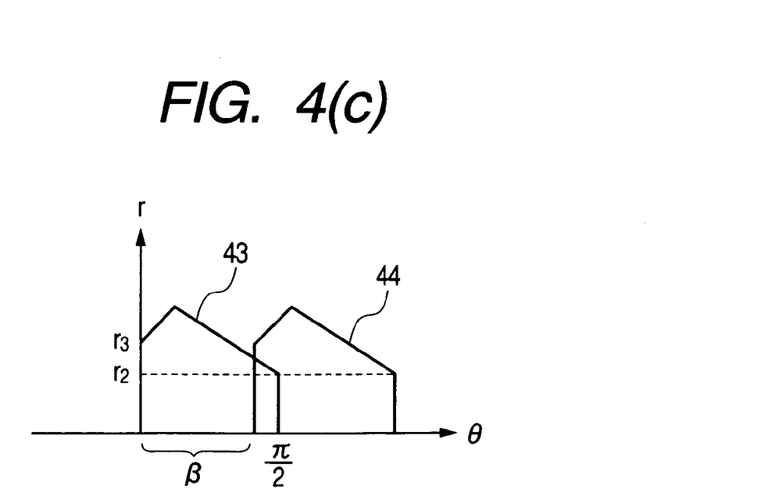

FIG. 4 is a drawing an example of polar coordinate conversion where a point on the contour of an image on the X-Y plane is used as an origin. Consider the case where the rectangular object 41, where one apex was positioned at the origin on the X-Y plane as shown in FIG. 4(a), has rotated about the coordinate origin by angle β as shown in FIG. 4(b). The object before and after rotation is plotted on the two-dimensional coordinate where "r" is assigned to the vertical axis and the "θ" on the horizontal axis. This will provide images 43 and 44 having the same profile where they are moved in parallel displacement by angle β in the θ direction, shown in FIG. 4.

Figure 5:
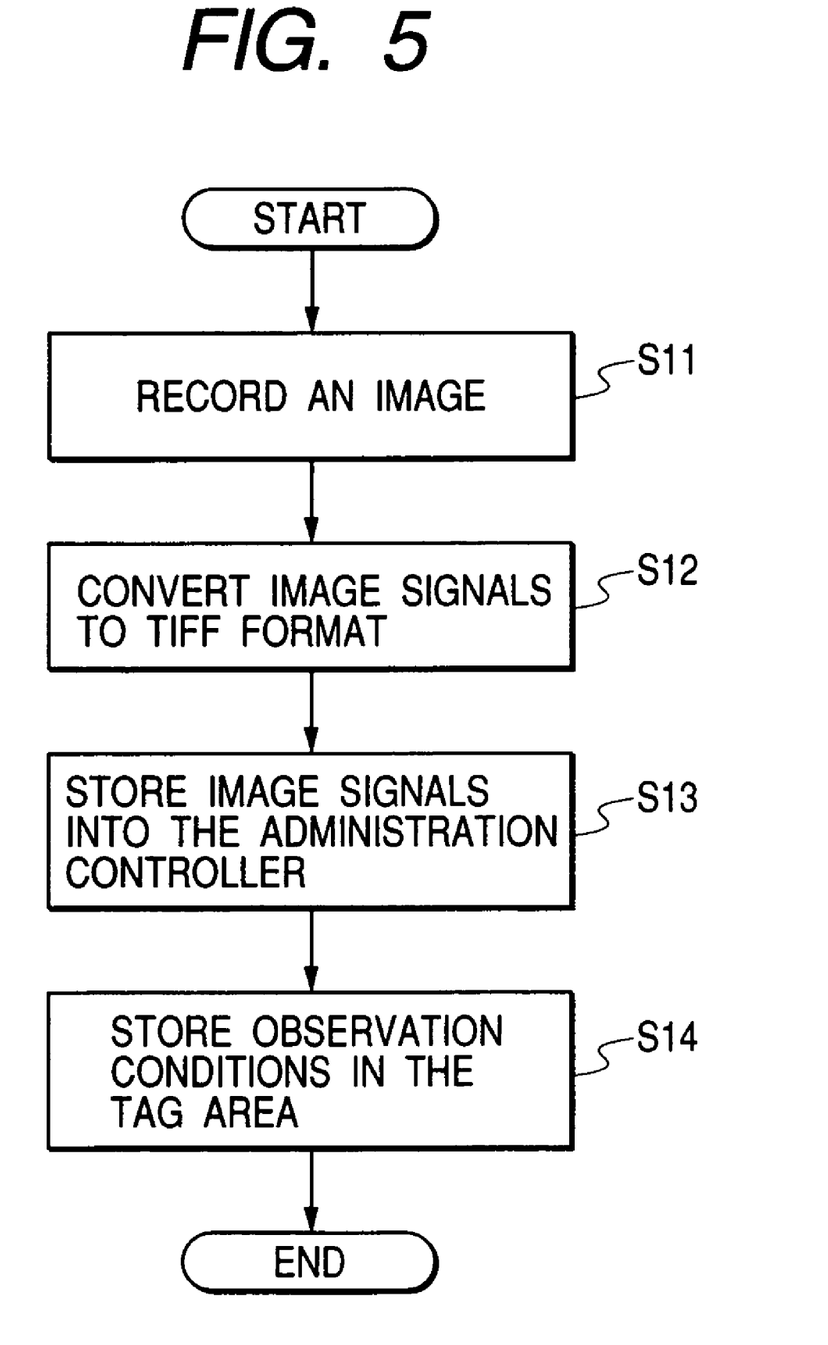
FIG. 5 is a flowchart showing the procedure of image record processing.

The following describes the processing of image recording, image recognition, image search and image calling according to the present invention:

The processing of image recording will be described first using the flowchart given in FIG. 5. An operator prepares a sample S to be observed, and operates a transmission electron microscope to set the observation conditions. Then the operator captures the enlarged image of a desired portion of the sample S using a TV camera 8. The operation in this case is carried out using input means 20 such as a keyboard. The operator enters the required control data into the electron gun controller 11, irradiation lens controller 12, object lens controller 13 and magnifying lens system controller 14 so that the desired acceleration voltage, scaling factor and observation mode can be obtained. Control data is also entered into the sample stage controller 15 and the sample stage 5 is operated in such a way that the desired portion of the sample 6 will be in the field of view.

The above operations will provide the image on the desired portion (coordinate) of the sample S according to desired conditions. When the image of a desired portion of the sample S under desired conditions is obtained, the operator performs the operation required to record the image in the administration controller 18 (S11). The administration controller 18 memorizes the transmission image of the sample captured from the TV camera 8 into the memory and stores it therein (S13). The object image captured through the TV camera 8 may be stored after it has been converted into the data of TIFF format. In this case, it is also possible to make such arrangements that, in parallel with storage of image data in Step 13, the administration controller 18 captures the observation conditions as data from the controllers 11 through 15, and this data is stored in the tag area of the TIFF format as the tag data of the image data (S14). The observation conditions for storing the tag data into the tag area includes acceleration voltage, scaling factor, emission current, spot size, sample position coordinate, exposure time and the amount of exposure.

Figure 6:
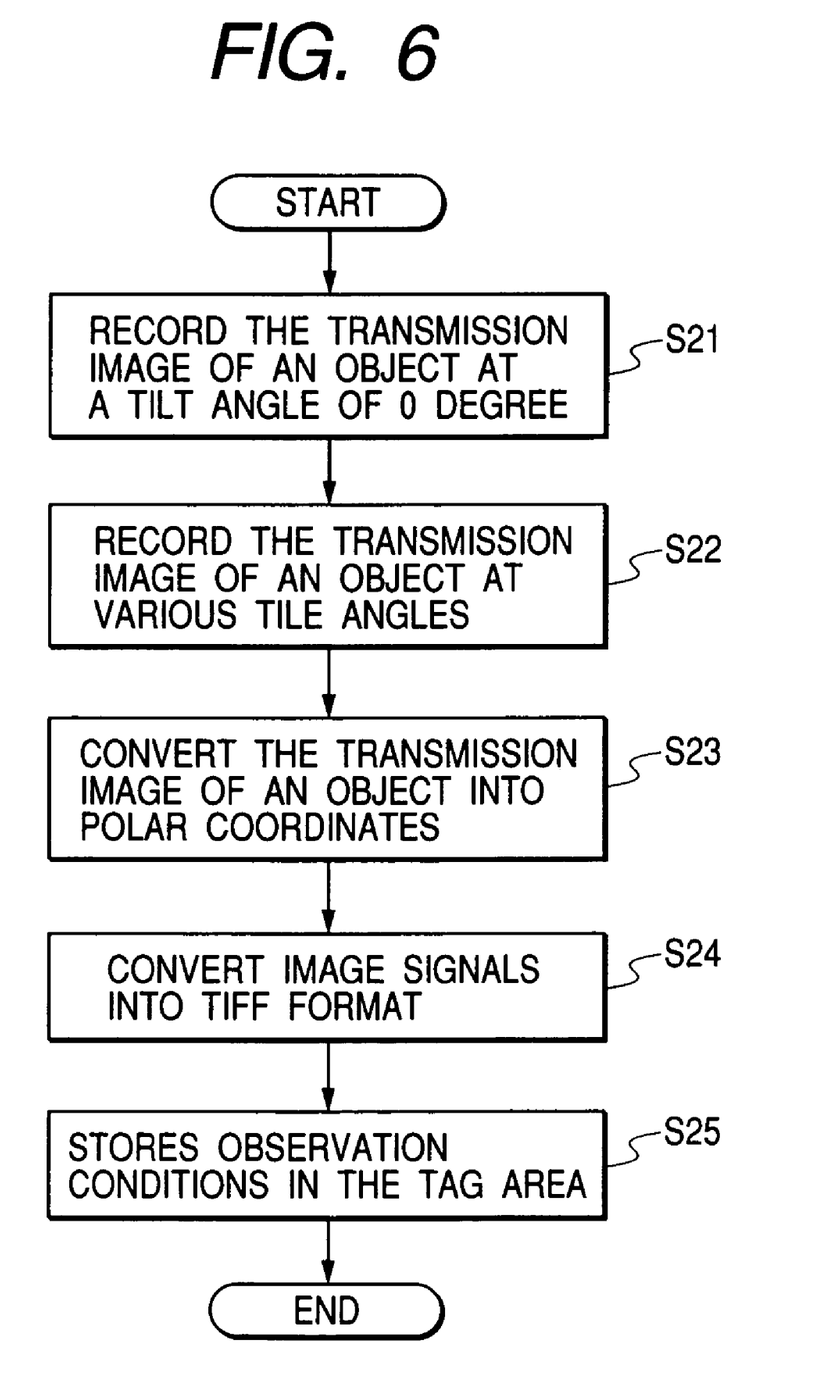
FIG. 6 is a flowchart showing the procedure of reference image record registration processing.

The following describes the processing of registering the referenced image with reference to the flowchart given in FIG. 6: Multiple transmission images of an object previously captured by tilting in multiple directions, and an image obtained by polar coordinate conversion of the transmission image, as will be described later, can be used as reference images. Further, a reference image can be created from the object itself contained in the sample S. In this case as well, the transmission image with the sample tilted for the object to be searched from samples and the image obtained from the transmission image having been subjected to polar coordinate conversion are registered as reference images.

When the tilt angle is zero degree without the sample state being tilted with respect to the optical axis, the transmission image of the object (reference image) is recorded (S21). Then the sample stage is tilted to record the transmission image of an object tilted at various angles (S22). After that, the reference image at a tilt angle of 0 degree and the reference image tilted at various angles are subjected to polar coordinate conversion, thereby obtaining an image (S23). Further, the image signal of the reference signal is converted into the TIFF format, and is stored in the administration controller 18 (S24). In parallel to the storage of the administration controller 18, the administration controller 18 captures the image observation condition as data from the controllers 11 through 15, and the captured data is stored as tag data of the image data in the tag area of TIFF format (S25). In the manner described above, the transmission image of the object tilted at various angles and the image obtained by polar coordinate conversion of such transmission image are used to create the image database of the reference image.

Figure 7:
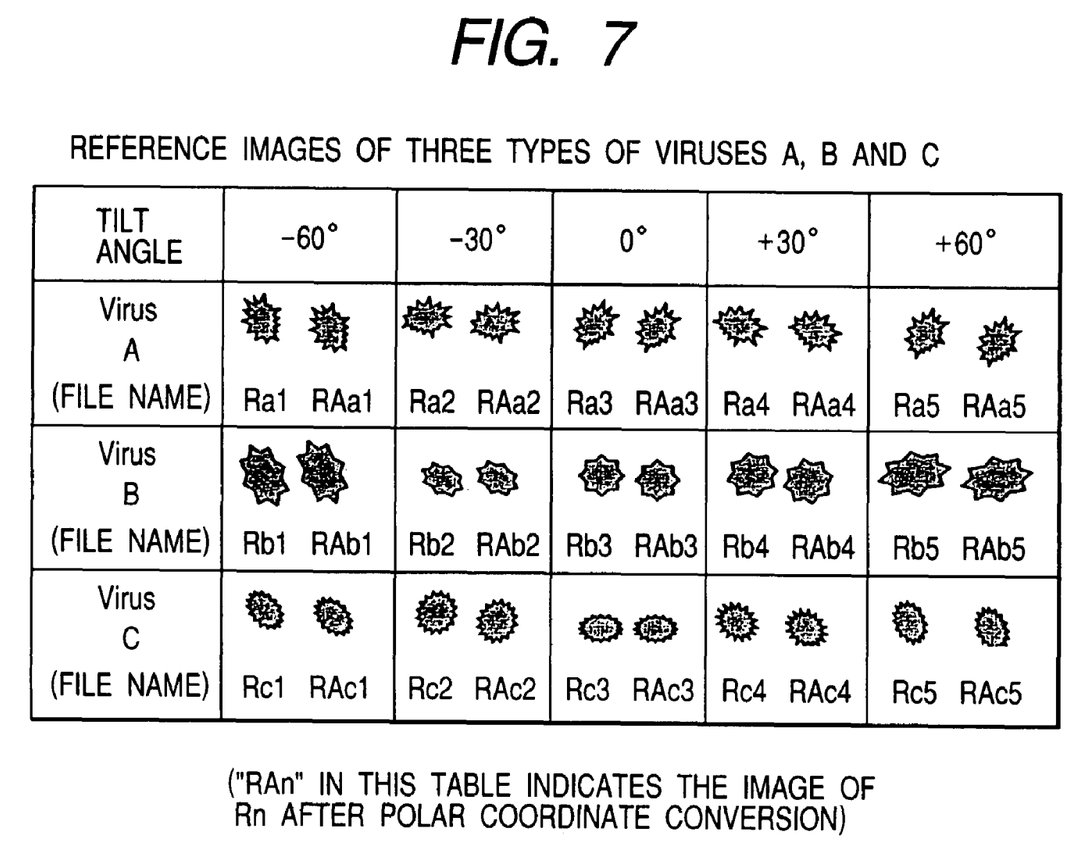
FIG. 7 is a diagram showing an example of listing the transmission images used as reference images.

FIG. 7 is a diagram showing an example of listing the transmission images used as reference images. In this figure, a virus is used as an object. The tilted transmission image of the object tilted at various angles with respect to the optical light and the image having been subjected to polar coordinate conversion are used as a database for the reference image. For example, the transmission images of virus A gained by tilting in a certain direction within the tilt angle of ±60 deg. in increments of 30 deg. are assumed as reference images Ra1, Ra2, Ra3, Ra4 and Ra5 of virus A. The transmission images gained by polar coordinate conversion of these images are registered as reference images RAa1, RAa2, RAa3, RAa4 and RAa5. A similar step is taken for virus B. Namely, the transmission images of virus B gained by tilting in a certain direction within the tilt angle of ±60 deg. in increments of 30 deg. are registered as reference images Rb1, Rb2, Rb3, Rb4 and Rb5 of virus B. The transmission images gained by polar coordinate conversion of these images are registered as reference images RAb1, RAb2, RAb3, RAb4 and RAb5 of virus B. Similarly for virus C, the transmission images of virus C gained by tilting in a certain direction within the tilt angle of ±60 deg. in increments of 30 deg. are assumed as reference images Rc1, Rc2, Rc3, Rc4 and Rc5 of virus C. The transmission images gained by polar coordinate conversion of these images are registered as reference images RAc1, RAc2, RAc3, RAc4 and RAc5.

Figure 8:
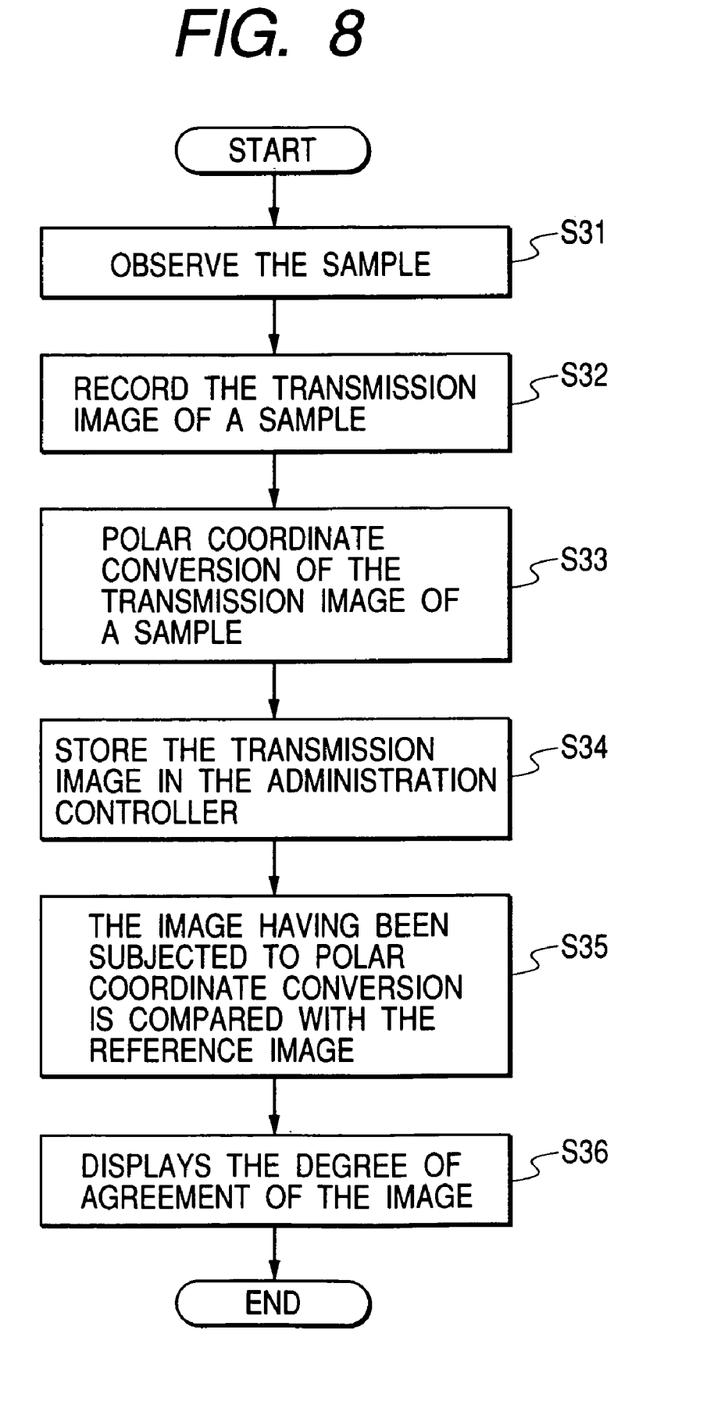
FIG. 8 is a diagram representing the procedure of image recognition.

The following describes the processing of image recognition with reference to FIG. 8: Image recognition is the processing carried out to compare between the transmission image of a desired sample and reference image. The sample is observed (S31) and the transparent image of a desired area in the samples is recorded (S32). Images are obtained by polar coordinate conversion of an object in the transmission images (S33). The transmission images and images subsequent to polar coordinate conversion are stored (S34). After that, comparison is made between the transmission images of the desired object in the sample images and reference images (S35). Comparison can be made using the correlation of images as in the phase-restricted correlation method. It is preferred that the correlation be found among images subsequent to polar coordinate conversion, because it is not affected by the rotation of the object. The result of image correlation can be displayed to represent the degree of agreement among images (S36).

The following describes the processing of image search: Image search is the processing of finding out the reference to which a desired object corresponds, or finding out a sample having the same profile as a desired object that is assumed as a reference. The scaling factor of the reference image and that of the image to be searched is preferred to be the same in principle. Should the scaling factor be changed, it is preferred that the scaling factor of the image be adjusted by ensuring that the observation condition for the reference image can be referenced in advance, when the sample image is recorded in the step of image recording.

Figure 9:
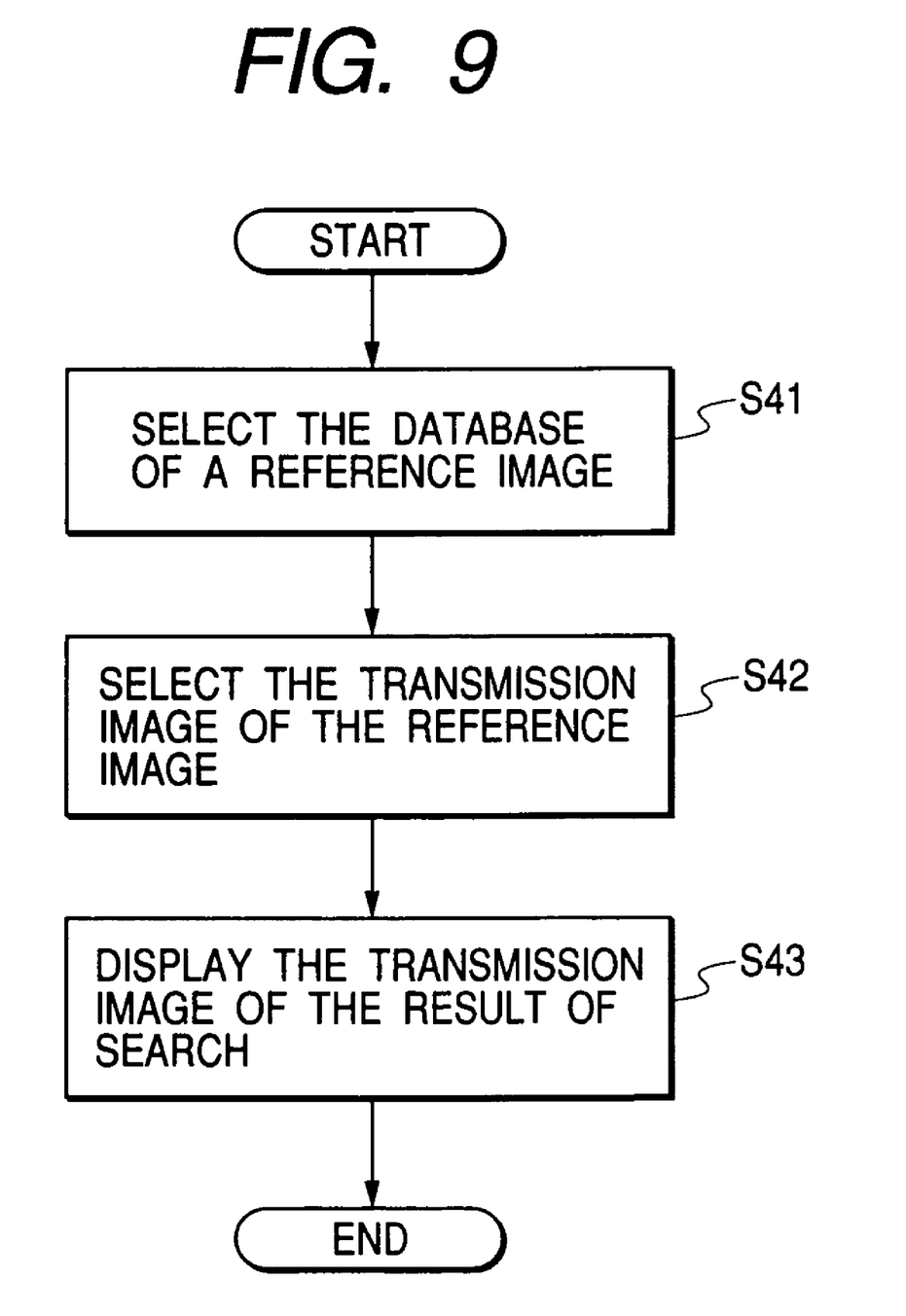
FIG. 9 is a flow chart representing the processing of image search.

FIG. 9 is a flow chart representing the processing of image search. In image search, the image database of a reference image is selected (S41). This reference image contains the transmission image of the sample itself to be searched and its tilted transmission image. Based on the degree of agreement of images displayed after processing of image recognition, a reference image closely correlated with the desired sample is selected (S42) and the selected transmission image is displayed (S43).

It is also possible to make such arrangements that the image of an object in the samples to be searched is correlated with the reference image, and the image is classified by comparison. Images be classified according to the database of the reference image; for example, the image of the object in the sample is the transmission image of virus A tilted by +30 deg. which is further rotated by 0 deg. by polar coordinate conversion. It is also possible to classify multiple samples, assuming a certain sample as a reference. It is also possible to find out a sample having the same profile as the reference sample from multiple samples by assuming a certain sample as a reference.

Figure 10A:
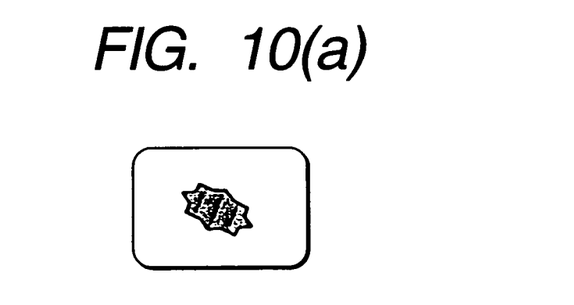
FIGS. 10(a) through 10(c) are explanatory diagrams representing an example of image search processing.

Referring to FIG. 10, the following describes an example of searching the image: In the first plate, the transmission image of a desired object contained in the sample is captured and stored. Assume that the transmission image of the object shown in FIG. 10(a) is to be searched as a transmission image. An image is obtained by polar coordinate conversion of the transmission image of the object, and is also stored. Then the database of the reference image is selected. Let us assume here that the database of the reference images for viruses A, B and C given in FIG. 7 has been selected. The result of search is outputted as the list showing the result of image correlation (degree of agreement) with the reference image.

Figure 10B:
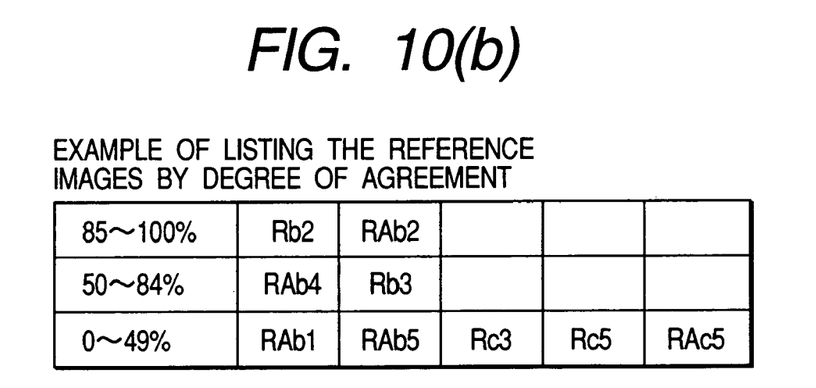
Figure 10C:
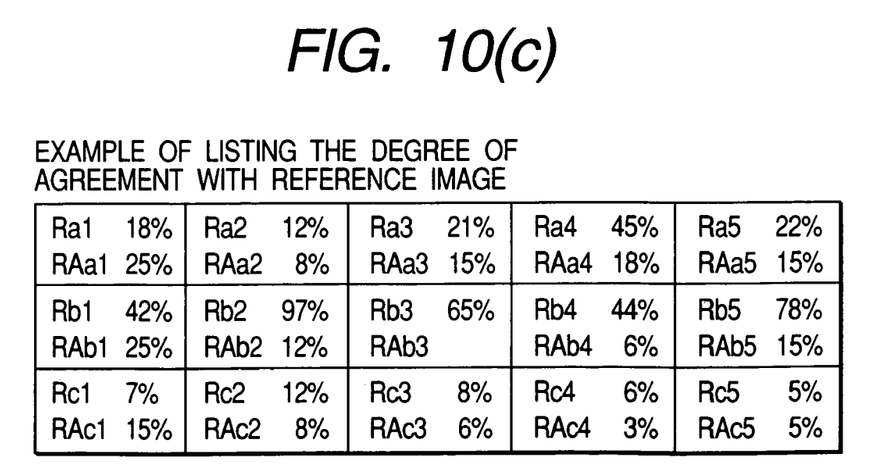

FIGS. 10(b) and 10(c) are the diagrams representing the examples of the result of search processing. FIG. 10(b) shows an example of listing the results of correlation between the sample image and individual reference images stored in the database, where these results are ranked according to the degree of agreement in the descending order. FIG. 10(c) is an example of listing the results of correlation between images, for each reference image in the database. According to this example, it is highly possible that the object in the sample is virus B.

Figure 11A:
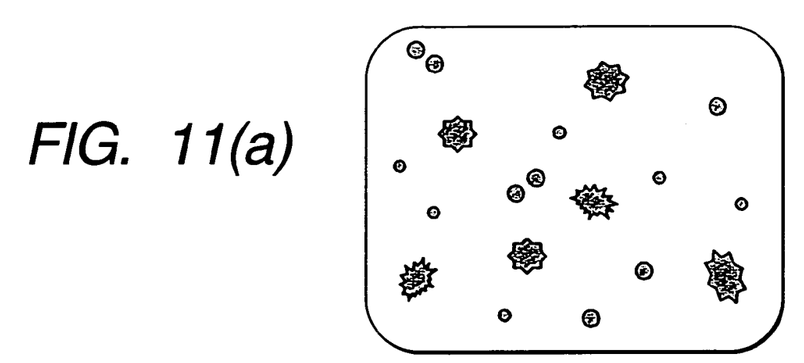
FIGS. 11(a) through 11(c) are explanatory diagrams representing an example of searching the same object as the reference image in the field of view for the sample.
Figure 11B:
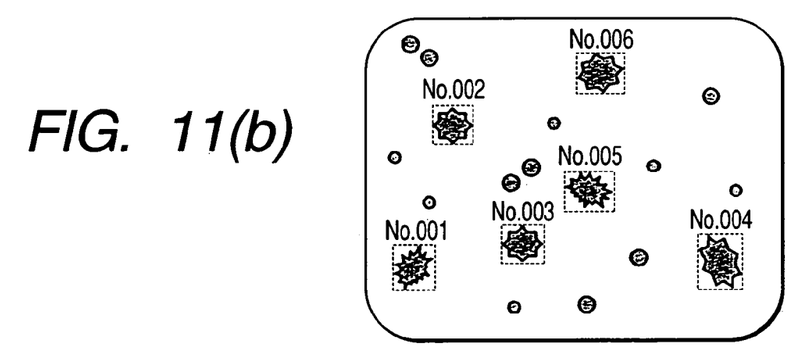
Figure 11C:
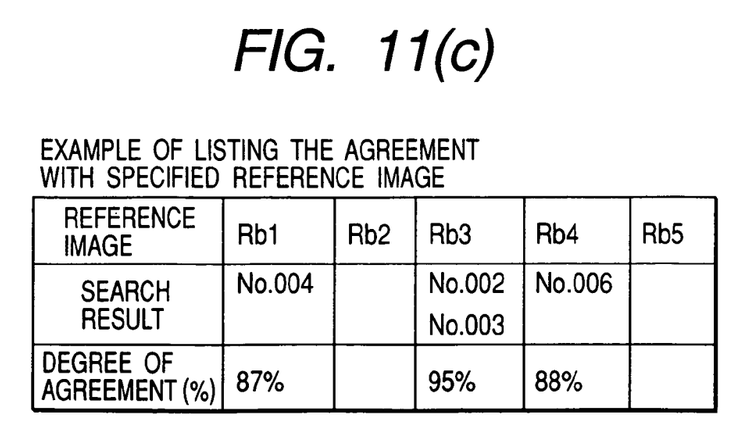

FIG. 11 is an explanatory diagram representing an example of searching the same object as the reference image in the field of view for the sample containing multiple objects.

In the first place, the field of view for the sample containing multiple objects are photographed and recorded, as shown in FIG. 11(a). Then multiple objects are selected from that field of view. When objects are selected, the objects can be enclosed by a frame having a certain size if the image is photographed by a CCD camera as illustrated in FIG. 11(b). The selected objects can be numbered as illustrated. In this example, six objects are selected.

This is followed by the step of selecting the reference image to be searched, from the reference image database. Here the series of virus B given in FIG. 7 are specified as reference images, by way of an example. Then selected objects are correlated with reference images, and the results are indicated. As shown in FIG. 11(c), the result is displayed in terms of the degree of agreement between the objects selected from the sample and reference image. To display the result of search, it is also possible to make such arrangements that the degree of agreement is provided with a threshold value in advance, and only the results of research where the degree of agreement has exceeded the threshold value are outputted. In this example, the results of search indicate a high possibility that objects Nos. 002 and 003 in the sample are viruses B. It can be seen that there is also a high possibility of objects Nos. 006 and 001 being viruses B as well.

FIG. 12 is an explanatory diagram representing an example of processing wherein an object having the same profile as that of the object is searched in the field of view for the sample containing multiple objects, with the object in the sample assumed as a reference.

Figure 12A:
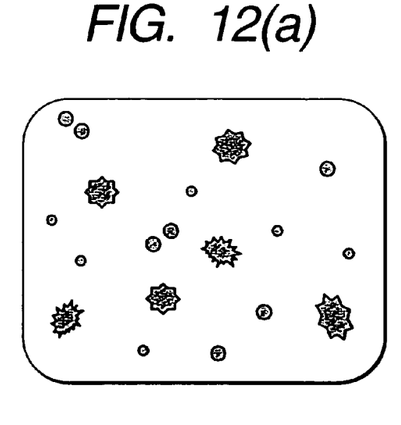
FIGS. 12(a) through 12(d) are explanatory diagrams representing an example of processing wherein an object having the same profile as that of the specified object is searched in the field of view for the sample.
Figure 12B:
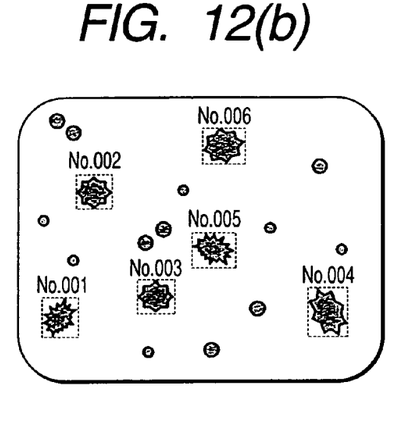
Figure 12C:
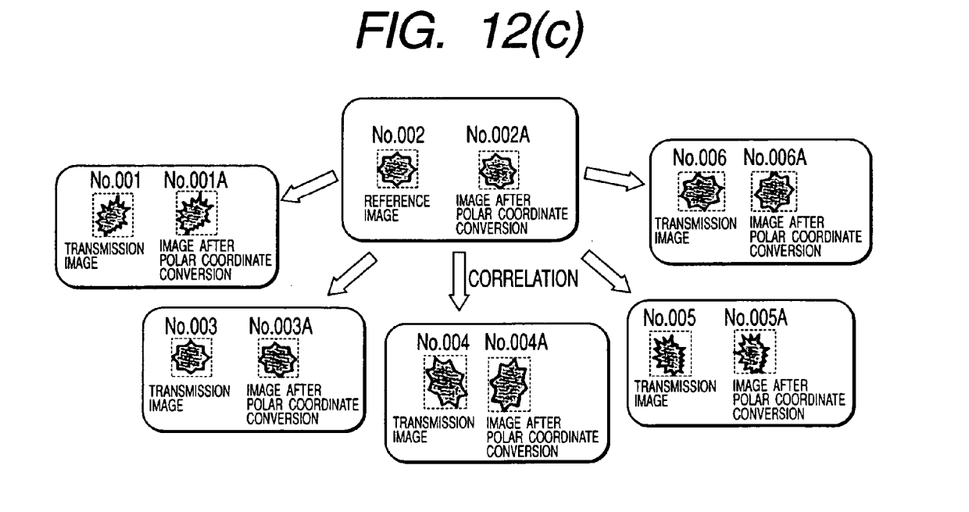

The field of view for the sample containing multiple objects are photographed and stored as shown in FIG. 12(a). Then a desired object sample is selected from the field of view. As shown in FIG. 12(b) the object is selected by enclosing the frame by a mouse. The selected object can be assigned with an appropriate number.

Figure 12D:
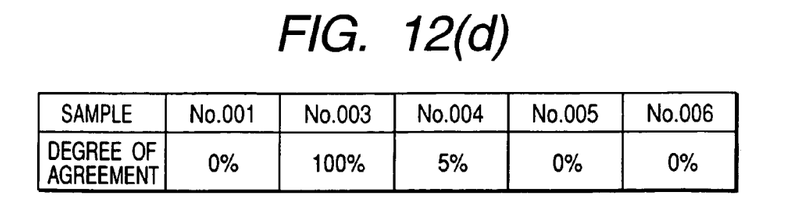

Then one object out of multiple selected objects is used as a target object, and its transmission image and the image obtained by polar coordinate conversion of the transmission image are used as reference images. Correlation is established with the remaining objects having been selected. For the transmission images of the objects other than the target object, the image having been subjected to polar coordinate conversion is prepared and computation of image correlation is carried out between transmission images and between images having been subjected to polar coordinate conversion. As a result, the object having the same profile as that of the target object is found out. FIG. 12(d) shows an example of displaying the search result. In this example, the object having the same profile as that of the object No. 002 found out in the sample is searched in the sample. It can be seen that there is a high possibility that the object No. 003 is relevant. The illustrated example shows the case where the unmodified profile is used as a reference without the sample being tilted at multiple angles. It is also possible to tilt the sample at various angles and to record the transmission images of the object, as required, thereby using them as reference images, together with the images having been subjected to polar coordinate conversion.

Figure 13:
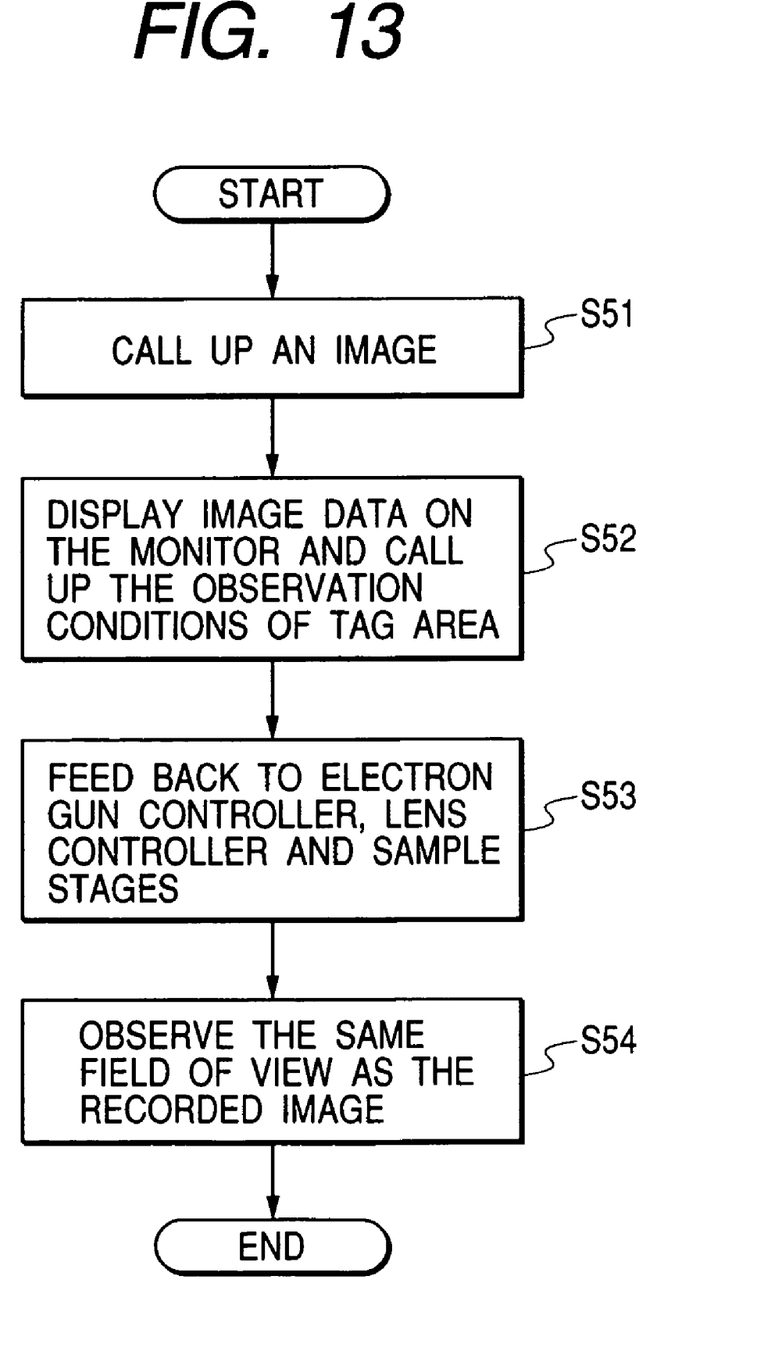
FIG. 13 is a flowchart representing the procedure of image calling.

The following describes the processing of image calling with reference to FIG. 13: Image calling is the processing applied to reproduce the observation condition of the searched object for observation. The image data of the searched object is converted into the TIFF format and is stored in the administration controller 18. The image data of the TIFF format has the observation conditions of the image stored in the tag area.

When a searched image is specified, the image data of the sample specified by the administration controller 18 is called up (S51). Then the administration controller 18 supplies this image to the monitor 17 so that the searched image stored is displayed on the monitor screen. Whenever required, the administration controller 18 calls up the tag data from this image data (S52), and supplies to the electron gun controller 11 and lens controllers 12 through 14, the control data representing the observation conditions such as acceleration voltage and scaling factor in the tag data (S53). This allows the sample stage 5 to move in such a way as to get the field of observation of the sample S specified by the tag data. Control is made to get the acceleration voltage, scaling factor, measurement mode (e.g. diffraction mode, high resolution mode, enhanced contrast mode or extra-low powered mode), thereby permitting observation of the same field of view as that of the recorded image (S54).

According to this method, when the sample S contains objects tilted in various angles with respect to the direction of incoming electron beam, the reference image is compared with the projected image of the object, and the degree of agreement is evaluated quantitatively, whereby only the image tilted in a particular direction can be selected from the field of view. This ensures efficient image analysis.

According to the prior art, an image is selected, for example, by the image pattern matching technique. However, the prior art does not use the arrangement of selecting the reference image to provide automatic selection of images based on the degree of agreement. Further, the image is not provided with observation conditions; therefore, even if an image has been selected, the observation conditions of the selected image cannot be reproduced for observation. In this case, the selected image cannot be recorded again under the same conditions, using a film and other recording medium, for example. According to the present invention, however, the image data is converted into the data of TIFF format and the observation conditions are stored in the tag area. This arrangement ensures observation conditions corresponding to the image at all times, and the corresponding observation conditions are obtained by mere calling of the image data at the same time. Further, there is little restriction on the amount of data to be stored. This provides a perfect reproduction of the observation conditions in an easy manner.

The present invention ensures an accurate and efficient selection of a target object out of the objects tilted at various angles. Further, it allows a recorded object image to be displayed, and permits the observation conditions to be fed back to an electron microscope, thereby ensuring easy and faithful reproduction of a recorded image on the electron microscope.

What is claimed is:

1. A sample observation method including recognizing images of objects in an electron microscope image of a sample containing multiple objects by computing it with previously stored reference images, comprising:

obtaining the electron microscope images of the multiple objects;

selecting images of the objects from the multiple objects in the electron microscope images;

computing a correlation between each of the selected objects and each of the stored reference images; and displaying the results of the computation for different objects;

wherein the multiple objects are located at different positions in the electron microscope images; and wherein the reference images are stored as two-dimensional images which are previously captured in multiple directions for each of three-dimensional objects.

2. The sample observation method according to claim 1, wherein the results of the correlation are displayed in terms of the correspondence between the objects and reference images.

3. The sample observation method according to claim 1, wherein the correlations which have been carried out by polar correlation conversion are computed from the selected images of the objects and the stored reference images.

4. The sample observation method according to claim 3, which further comprises:

specifying fulcrums for rotation in the polar coordination conversion of the objects in the electron microscope images.

5. An electron microscope comprising:

an electron gun for emitting an electron beam;

an objective lens for focusing the electron beam emitted from the electron gun, wherein the electron beam is applied to a sample including multiple objects to form images of the objects; and an administration controller for storing reference images of objects obtained from a sample including multiple objects and for computing a correlation between each of the selected objects and each of the reference images, wherein the administration controller stores the reference images as two-dimensional images which are previously captured in multiple directions for each of three-dimensional objects.

6. An electron microscope comprising:

an electron gun for emitting an electron beam;

an objective lens for focusing the electron beam emitted from the electron gun, wherein the electron beam is applied to a sample including multiple objects to form images of the objects, an administration controller for storing reference images of objects obtained from a sample including multiple objects and for computing a correlation between each of the selected objects and each of the reference images, wherein the administration controller stores the reference images as two-dimensional images which are previously captured in multiple directions for each of three-dimensional objects, and identifies the object by computing a correlation between the object selected in the sample and each of the stored reference images.

* * * * *